United States Patent [19]
Takeda et al.

[11] Patent Number: 5,834,338
[45] Date of Patent: Nov. 10, 1998

[54] CHIP CARRIER SEMICONDUCTOR DEVICE ASSEMBLY AND A METHOD FOR FORMING THE SAME

[75] Inventors: Hidetoshi Takeda; Manabu Bonkohara, both of Tokyo, Japan

[73] Assignee: NEC Corporation, Tokyo, Japan

[21] Appl. No.: 717,455

[22] Filed: Sep. 20, 1996

Related U.S. Application Data

[62] Division of Ser. No. 358,005, Dec. 16, 1994.

[30] Foreign Application Priority Data

Dec. 16, 1993 [JP] Japan .................................... 5-317080

[51] Int. Cl.⁶ .................................................. H01L 21/60
[52] U.S. Cl. ........................................... 438/123; 438/126
[58] Field of Search ..................................... 437/182, 217, 437/219, 220; 257/673, 692, 735, 778; 438/123, 126

[56] References Cited

U.S. PATENT DOCUMENTS 5,083,191  1/1992  Ueda ......................................... 257/737
5,229,916  7/1993  Frankeny et al. .
5,350,947  9/1994  Takekawa et al. ...................... 257/778
5,477,611  12/1995  Sweis et al. ............................. 437/219

FOREIGN PATENT DOCUMENTS 2-58245     2/1990  Japan .
03-032040   2/1991  Japan .
3-32040     2/1991  Japan .

OTHER PUBLICATIONS

Matthew, L., et al., "Future Directions in TAB: The TCC/MCM Interconnect", *ITAP & Flip Chip Proceedings*, Dec. 1994, pp. 228–231.

IBM Microelectronics, Tape Ball Grid Array (TBGA), Doc. #SPMATBSFU–03, Aug., 1993, four pages.

*Primary Examiner*—John Niebling
*Assistant Examiner*—Kevin F. Turner
*Attorney, Agent, or Firm*—Young & Thompson

[57] ABSTRACT

A chip carrier semiconductor device comprises a semiconductor chip having a surface on which a plurality of contact pads, a tape carrier overlying the semiconductor chip and a plurality of leads provided on the tape carrier to overly the semiconductor chip, each of the leads having an inside end being provided with at last one bump for bonding a board, the bump being positioned on an inside area of the contact pads.

2 Claims, 3 Drawing Sheets

CHIP CARRIER SEMICONDUCTOR DEVICE ASSEMBLY AND A METHOD FOR FORMING THE SAME

This application is a division of copending application Ser. No. 08/358, 005, filed Dec. 16, 1994.

BACKGROUND OF THE INVENTION

The invention relates to a chip carrier semiconductor device assembly and a method for forming the same.

In a conventional tape automated bonding method, a semiconductor chip is bonded on a packaging substrate by an inner lead bonding method wherein pads of the semiconductor chip are bonded to bumps provided at the top portion of inner leads of a tape carrier as well as by a soldering bonding between outer leads of the tape carrier. Those techniques of inner lead bonding and outer lead bonding are disclosed in Mar. 27, 1991 "Microelectronics Packaging Handbook" pp. 326–347.

It has been known in the art to further provide connective terminals at insides of the chip in addition to peripheral leads in order to permit an increase in the number of the connections of the chip. This technique is known as area tape automated bonding developed by IBM Corporation.

Another technique to increase the number of connective pins is disclosed in the Japanese laid-open patent application No. 2-58245 wherein contact pads are arranged on a peripheral portion of the chip to form two staggered rows so that leads extend from the contact pads of the inside and the outside rows in an outward direction to permit an increase in the number of the connections of the chip.

Still another technique of a bumpless bonding method to increase of the number of connective pins is disclosed in the Japanese laid-open patent application No. 2-58245 wherein wedge bonding is used.

The foregoing prior arts suffers from problems as described below. In the tape automated bonding method, bonding of the automated bonding tape on the packaging substrate is carried out by soldering the outer leads thereby resulting in an enlargement of a packaging area up to a few times that of a chip area. The area tape automated bonding method and the double aligned connection technique also suffer from these problems. On the other hand, a flip chip bonding method has a problem as described below. In the flip chip bonding, after packaging the semiconductor chip on the packaging substrate through the bump, it is necessary to seal the chip with a sealing resin. Actually, there is a possibility of an incomplete sealing thereby lowering productivity.

SUMMARY OF THE INVENTION

Accordingly, it is an object of the present invention to provide a novel chip carrier semiconductor device free from any disadvantages as described above.

It is a further object of the present invention to provide a novel chip carrier semiconductor device permitting a reduction of a packaging area.

It is a furthermore object of the present invention to provide a novel chip carrier semiconductor device permitting an improvement in productivity.

It is a moreover object of the present invention to provide a novel chip carrier semiconductor device permitting a high accuracy connection of a large number of connection pins.

It is another object of the present invention to provide a novel method of forming a chip carrier semiconductor device free from any disadvantages as described above.

It is still another object of the present invention to provide a novel method of forming a chip carrier semiconductor device permitting a reduction of a packaging area.

It is yet another object of the present invention to provide a novel method of forming a chip carrier semiconductor device permitting an improvement in productivity.

It is an additional object of the present invention to provide a novel method of forming a chip carrier semiconductor device permitting a high accuracy connection of a large number of connection pins.

The above and other objects, features and advantages of the present invention will be apparent from the following descriptions.

The invention provides a novel chip carrier semiconductor device assembly comprising a packaging substrate ; a semiconductor chip having a surface on which a plurality of contact padslie ; a tape carrier overlying the semiconductor chip; and a plurality of leads provided on the tape carrier to overlie the semiconductor chip, each of the leads having an inside end being provided with at least one bump, the bump being positioned on an inside area of the contact pads so that the semiconductor chip is bonded to the packaging substrate through the bumps inside the contact pads.

The invention provides a novel chip carrier semiconductor device comprising a semiconductor chip having a surface on which a plurality of contact padslie ; a tape carrier overlying the semiconductor chip ; and a plurality of leads provided on the tape carrier to overlie the semiconductor chip, each of the leads having an inside end being provided with at least one bump for bonding a board, the bump being positioned on an inside area of the contact pads. The invention further provides a novel method of forming a chip carrier semiconductor device. A semiconductor chip is provided with a plurality of contact pads. A tape carrier is provided with a plurality of openings and a plurality of leads in which each of the leads has an inside end being provided thereon with at least one bump and has a bent portion. The tape carrier is superimposed on the semiconductor chip so that the bent portions of the leads make contact with the contact pads to form a space defined between the tape carrier and the semiconductor chip. A sealing resin is introduced through at least one of the openings into the space to seal a surface of the semiconductor chip.

The invention also provides a novel method of forming a chip carrier semiconductor device assembly. A semiconductor chip is provided with a plurality of contact pads. A tape carrier is provided with a plurality of openings and a plurality of leads in which each of the leads has an inside end being provided thereon with at least one bump and has a bent portion. The tape carrier is superimposed on the semiconductor chip so that the bent portions of the leads make contact with the contact pads to form a space defined between the tape carrier and the semiconductor chip. A sealing resin is introduced through at least one of the openings into the space to seal a surface of the semiconductor chip. The semiconductor chip is subjected to performance tests by use of external test probes. The tape carrier is cut so as to separate the semiconductor chip and a part of the tape carrier within an chip area from the remaining part of the tape carrier. The semiconductor chip is bonded to a packaging substrate through the bumps.

BRIEF DESCRIPTIONS OF THE DRAWINGS

Preferred embodiments of the present invention will hereinafter fully be described in detail with reference to the accompanying drawings.

PREFERRED EMBODIMENTS OF THE PRESENT INVENTION

Figure 1:
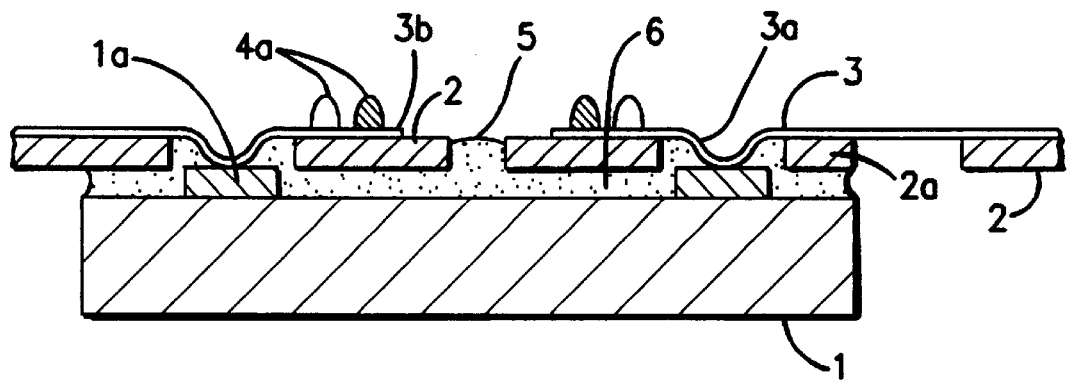
FIG. 1 is a fragmentary cross sectional elevation view of a novel chip carrier semiconductor device in a first embodiment according to the present invention.

A first embodiment according to the present invention will be described with reference to FIGS. 1 and 9 in which a novel tape carrier structure bonded on a semiconductor chip before bonding the semiconductor chip on a packaging substrate is provided.

Figure 9:
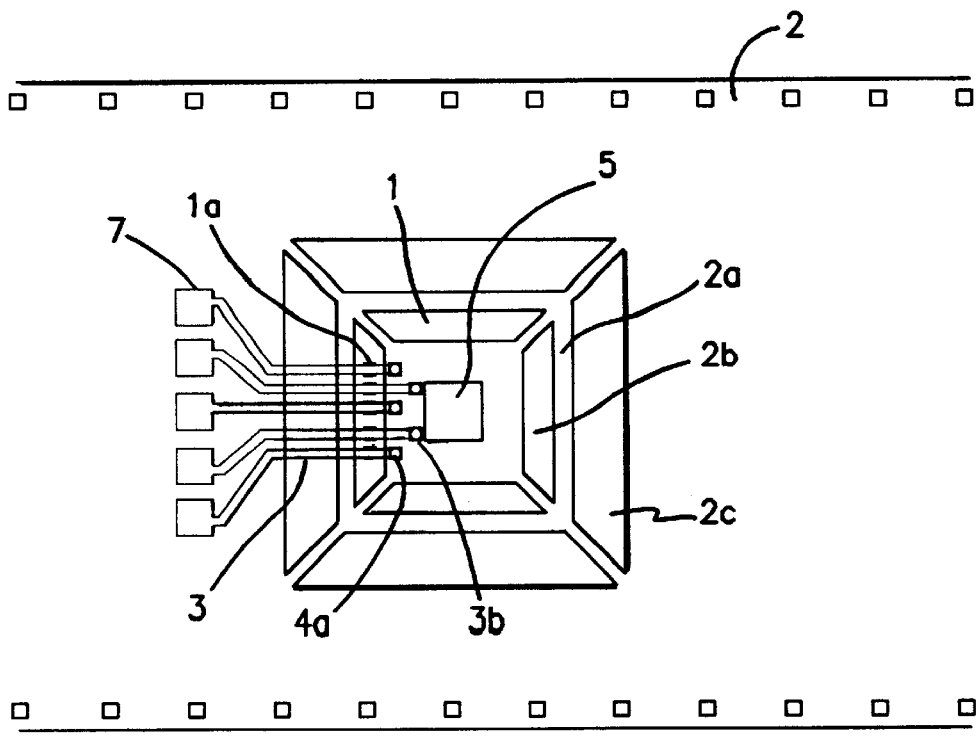
FIG. 9 is a plane view illustrative of a novel chip carrier semiconductor device according to the present invention.

As illustrated in FIG. 9, a semiconductor chip 1 is provided on a tape carrier 2 that has a center opening 5 and intermediate openings 2b formed to be spaced apart from the center opening 5 and to surround the center opening 5 and peripheral openings 2c being formed to be spaced part from the intermediate openings 2b spaced apart and to surround the intermediate openings 2b. An area of the tape carrier 2 defined between the intermediate and peripheral openings 2b and 2c may serve as a tape frame 2a along which the semiconductor chip 1 is cut from the tape carrier 2. The tape frame 2a has a just larger size than the semiconductor chip 1. A plurality of leads are provided on the tape carrier 2. Each of the leads has one end 3b being fined on the tape carrier 2 and being provided thereon with bumps in random for subsequent bonding of the semiconductor chip to the packaging substrate which is not illustrated. Each of the leads also has an opposite end being expanded to form a test pad 7 to which a test probe makes contact.

Referring back to FIG. 1, the semiconductor chip 1 is provided thereon with a plurality of contact pads 1a positioned under the intermediate openings 2b of the tape carrier 2. Each of the leads 3 has a bent portion 3a through which the leads 3 make contact with the contact pads 1a so that the leads 3 are electrically connected to the semiconductor chip 1.

The contact pads 1a may be made of aluminum. The pads of the packaging substrate are provided to have a sufficient distance in the range of 200 to 500 micrometers. The random arrangement of the bumps may ensure the necessary distance between the pads of the packaging substrate, pad sizes and bump height thereby permitting a high accuracy connection and an increase in the number of the contact pins. The tape carrier 2 may be made of a polyimide resin having a thickness of 30 micrometers. The leads may be made of copper having a height of 30 micrometers and a width of 80 micrometers. The bumps 4a may comprise boll bumps made of gold or copper, or alternatively may comprise solder bumps of Sn—Pb having a diameter of 100 micrometers and a height of 80 micrometers. Through the center opening 5 of the tape carrier 2, a sealing resin 6 is introduced into a space defined between the semiconductor chip 1 and the tape carrier 2 for sealing a surface of the semiconductor chip 1. The sealing resin 6 may comprise an epoxy resin or a resin including silicon.

The following description will focus on the process of the formation of the chip carrier semiconductor device as described above and illustrated in FIG. 1. The center, intermediate and peripheral openings 5, 2b and 2c as well as the leads 3 with the bumps 4a are formed in the tape carrier 2. The tape carrier 2 is positioned to overlap the semiconductor chip so that the bent portions 3a of the leads 3 make contact with the contact pads 1a through the intermediate openings 2b. The sealing resin 6 is introduced through the center opening 5 into the space defined between the surface of the semiconductor chip 1 and the tape carrier 2 for sealing the surface of the semiconductor chip 1. The external test probes make contact with the test pads 7 for conducting various tests of performances of the semiconductor chip 1 such as electrical tests or burn-in tests. The tape carrier 2 is cut to separate the semiconductor substrate 1 from the tape carrier 2. Thus, the test pads 7 are simultaneously separated from the semiconductor ship 1 to thereby permit the bonding of the semiconductor chip 1 on the packaging substrate not illustrated.

According to the present invention, the tape carrier 2 is cut to leave almost the same area as the area of the semiconductor chip 1. The packaging area in the present invention is smaller than the packaging area in the tape automated bonding. After sealing of the semiconductor chip 1 by the sealing resin 6, the performance test of the semiconductor chip 1 is conducted by use of the test probes for subsequent cutting of the tape carrier 2 to permit the packaging of the semiconductor chip 1 on the packaging substrate thereby permitting an improvement of productivity. Further, the random arrangement of the bumps may ensure the necessary distance between the pads of the packaging substrate, pad sizes and bump height thereby permitting a high accuracy connection and an increase of the number of the contact pins.

A second embodiment according to the present invention will be described with reference to FIG. 2 in which a novel tape carrier structure bonded on a semiconductor chip before bonding the semiconductor chip to a packaging substrate is provided.

The chip carrier semiconductor device of the second embodiment has a structural difference from that of the first embodiment in that the tape frame size is the same size as the semiconductor chip 1. Namely, the tape frame size of the second embodiment is smaller than the tape frame size of the first embodiment. This may permit a further reduction of the packaging area rather than the packaging area of the first embodiment. The semiconductor chip 1 is provided on the tape carrier 2 that has a center opening 5, and intermediate openings 2b formed to be spaced apart from the center opening 5 and to surround the center opening 5, and peripheral openings 2c being formed to be spaced apart from the intermediate openings 2b spaced apart and to surround the intermediate openings 2b. An area of the tape carrier 2 defined between the intermediate and peripheral openings 2b and 2c may serve as a tape frame 2a which along with the semiconductor chip 1 is cut from the tape carrier 2. The tape frame 2a has a slightly larger size than the semiconductor chip 1. A plurality of leads is provided on the tape carrier 2. Each of the leads has one end 3b being found on the tape carrier 2 and being provided thereon with bumps in random for subsequent bonding of the semiconductor chip to the packaging substrate which is not illustrated. Each of the leads also has an and opposite end being expanded to form a test pad 7 to which a test probe makes contact.

Figure 2:
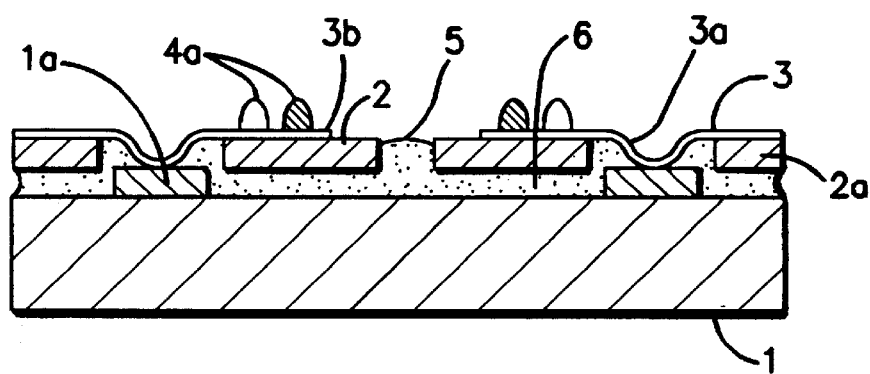
FIG. 2 is a fragmentary cross sectional elevation view of a novel chip carrier semiconductor device in a second embodiment according to the present invention.

Referring to FIG. 2, the semiconductor chip 1 is provided thereon with a plurality of contact pads 1a positioned under the intermediate openings 2b of the tape carrier 2. Each of the leads 3 has a bent portion 3a through which the leads 3 makes contact with the contact pads 1a so that the leads 3 are electrically connected to the semiconductor chip 1.

The following description will focus on the process of the formation of the chip carrier semiconductor device as described above and illustrated in FIG. 2. The center, intermediate and peripheral openings 5, 2b and 2c as well as the leads 3 with the bumps 4a are formed in the tape carrier 2. The tape carrier 2 is positioned to overlap the semiconductor chip so that the bent portions 3a of the leads 3 make contact with the contact pads 1a through the intermediate openings 2b. The sealing resin 6 is introduced through the center opening 5 into the space defined between the surface of the semiconductor chip 1 and the tape carrier 2 for sealing the surface of the semiconductor chip 1. The external test probes makes contact with the test pads 7 for conducting various tests of performances of the semiconductor chip 1 such as electrical tests or burn-in tests. The tape carrier 2 is cut to separate the semiconductor substrate 1 from the tape carrier 2. Thus, the test pads 7 are simultaneously separated from the semiconductor ship 1 to thereby permit the bonding of the semiconductor chip 1 on the packaging substrate not illustrated.

According to the present invention, a tape frame size is the same as a size of the semiconductor chip 1. Namely, the tape frame size of the second embodiment is smaller than the tape frame size of the first embodiment. This may permit a further reduction of the packaging area rather than the packaging area of the first embodiment. The tape carrier 2 is cut to leave almost the same area as the area of the semiconductor chip 1. The packaging area in the present invention is smaller than the packaging area in the tape automated bonding. After sealing of the semiconductor chip 1 by the sealing resin 6, the performance test of the semiconductor chip 1 is conducted by use of the test probes for subsequent cutting of the tape carrier 2 to permit the packaging of the semiconductor chip 1 on the packaging substrate 1 thereby permitting an improvement of productivity. Further, the random arrangement of the bumps may ensure the necessary distance between the pads, pad sizes and bump height thereby permitting a high accuracy connection and an increase of the number of the contact pins.

A third embodiment according to the present invention will be described with reference to FIG. 3 in which a novel tape carrier structure bonded on a semiconductor chip before bonding the semiconductor chip to a packaging substrate is provided.

The chip carrier semiconductor device of the third embodiment has a structural difference from that of the second embodiment in that the tape frame size is smaller than the size of the semiconductor chip 1. Namely, the tape frame size of the third embodiment is smaller than the tape frame size of the second embodiment. This may permit a furthermore reduction of the packaging area rather than the packaging area of the second embodiment.

A sealing resin 6 is introduced through a center opening not illustrated into a space defined in a vertical direction between a surface of the semiconductor chip and in a horizontal direction between the tape frames 2a. Namely, the sealing resin 6 is prevented by the tape frames 2a to flow outside the tape frames 2a so that the sealing resin 6 is securely defined within the area of the semiconductor chip 1.

The semiconductor chip 1 is provided on the tape carrier 2 that has a center opening 5 and intermediate openings 2b formed to be spaced apart from the center opening 5 and to surround the center opening 5 and peripheral openings 2c being formed to be spaced apart from the intermediate openings 2b spaced apart and to surround the intermediate openings 2b. An area of the tape carrier 2 defined between the intermediate and peripheral openings 2b and 2c may serve as a tape frame 2a which along with the semiconductor chip 1 is cut from the tape carrier 2. The tape frame 2a has a slightly larger size than the semiconductor chip 1. A plurality of leads is provided on the tape carrier 2. Each of the leads has one end 3b being found on the tape carrier 2 and being provided thereon with bumps in random for subsequent bonding of the semiconductor chip to the packaging substrate which is not illustrated. Each of the leads also has an opposite end being expanded to form a test pad 7 to which a test probe makes contact.

Figure 3:
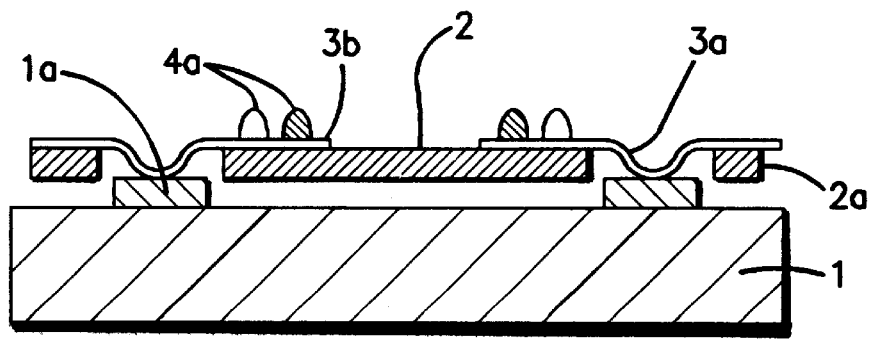
FIG. 3 is a fragmentary cross sectional elevation view of a novel chip carrier semiconductor device in a third embodiment according to the present invention.

Referring to FIG. 3, the semiconductor chip 1 is provided thereon with a plurality of contact pads 1a positioned under the intermediate openings 2b of the tape carrier 2. Each of the leads 3 has a bent portion 3a through which the leads 3 make contact with the contact pads 1a so that the leads 3 are electrically connected to the semiconductor chip 1.

The following description will focus on the process of the formation of the chip carrier semiconductor device as described above and illustrated in FIG. 3. The center, intermediate and peripheral openings 5, 2b and 2c as well as the leads 3 with the bumps 4a are formed in the tape carrier 2. The tape carrier 2 is positioned to overlap the semiconductor chip so that the bent portions 3a of the leads 3 make contact to the contact pads 1a through the intermediate openings 2b. The sealing resin 6 is introduced through the center opening 5 into the space defined between the surface of the semiconductor chip 1 and the tape carrier 2 for sealing the surface of the semiconductor chip 1. The external test probes make contact with the test pads 7 for conducting various tests of performances of the semiconductor chip 1 such as electrical tests or burn-in tests. The tape carrier 2 is cut to separate the semiconductor substrate 1 from the tape carrier 2. Thus, the test pads 7 are simultaneously separated from the semiconductor ship 1 to thereby permit the bonding of the semiconductor chip 1 on the packaging substrate not illustrated.

According to the present invention, a tape frame size is smaller than the size of the semiconductor chip 1. Namely, the tape frame size of the third embodiment is smaller than the tape frame size of the second embodiment. This may permit a further reduction of the packaging area. The tape carrier 2 is cut to leave a the smaller area than the area of the semiconductor chip 1. The packaging area in the present invention is smaller than the packaging area in the tape automated bonding. After sealing of the semiconductor chip 1 by the sealing resin 6, the performance test of the semiconductor chip 1 is conducted by use of the test probes for subsequent cutting of the tape carrier 2 to permit the packaging of the semiconductor chip 1 on the packaging substrate thereby permitting an improvement of productivity. Further, the random arrangement of the bumps may ensure the necessary distance between the pads, pad sizes and bump height thereby permitting a high accuracy connection and an increase of the number of the contact pins.

Figure 4:
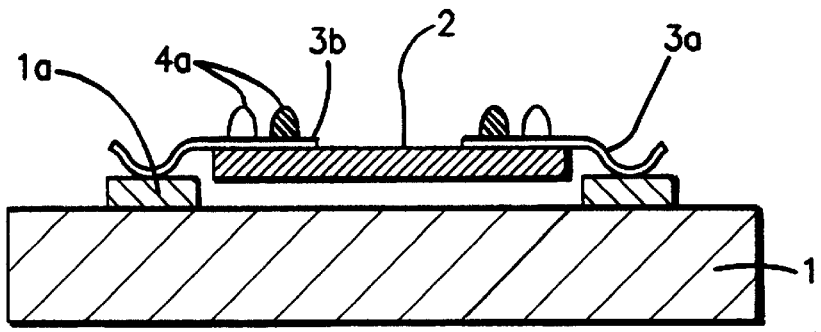
FIG. 4 is a fragmentary cross sectional elevation view of a novel chip carrier semiconductor device in a fourth embodiment according to the present invention.

A fourth embodiment according to the present invention will be described with reference to FIG. 4 in which a novel tape carrier structure bonded on a semiconductor chip before bonding the semiconductor chip to a packaging substrate is provided.

The chip carrier semiconductor device of the fourth embodiment has a structural difference from that of the third embodiment in that the sealing resin 6 is defined in a smaller area than the area of the third embodiment an a larger gap is provided on a bottom of the semiconductor chip 1 in the fourth embodiment thereby facilitating the introduction of the sealing resin 6 to seal the surface of the semiconductor chip 1.

A fifth embodiment according to the present invention will be described with reference to FIG. 5 in which a novel tape carrier structure bonded on a semiconductor chip before bonding the semiconductor chip to a packaging substrate is provided.

The chip carrier semiconductor device of the fifth embodiment has a structural difference from that of the first embodiment in that the tape carrier, that has been cut, extends over the size of the semiconductor chip 1 to ensure a larger area of the remaining tape carrier 2 after cutting the tape carrier 2. This may permit the leads to extend outside the semiconductor chip 1 on the tape carrier 2 extending over the chip area. This may further permit providing extra bumps to increase the number of the connections between the semiconductor chip 1.

The semiconductor chip 1 is provided on the tape carrier 2 that has a center opening 5, intermediate openings 2b formed to be spaced apart from the center opening 5 and to surround the center opening 5, and peripheral openings 2c being formed to be spaced apart from the intermediate openings 2b spaced apart and to surround the intermediate openings 2b. An area of the tape carrier 2 defined between the intermediate and peripheral openings 2b and 2c may serve as a tape frame 2a which along with the semiconductor chip 1 is cut from the tape carrier 2. The tape frame 2a has a slightly larger size than the semiconductor chip 1. A plurality of leads is provided on the tape carrier 2. Each of the leads has one end 3b being found on the tape carrier 2 and being provided thereon with bumps in random for subsequent bonding of the semiconductor chip to the packaging substrate which is not illustrated. Each of the leads also has an opposite end being expanded to form a test pad 7 to which a test probe makes contact.

Figure 5:
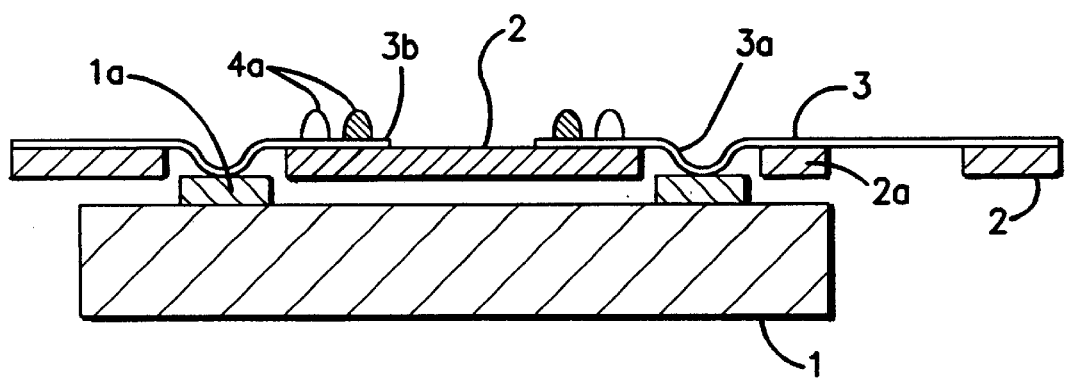
FIG. 5 is a fragmentary cross sectional elevation view of a novel chip carrier semiconductor device in a fifth embodiment according to the present invention.

Referring to FIG. 5, the semiconductor chip 1 is provided thereon with a plurality of contact pads 1a positioned under the intermediate openings 2b of the tape carrier 2. Each of the leads 3 has a bent portion 3a through which the leads 3 make contact with the contact pads 1a so that the leads 3 are electrically connected to the semiconductor chip 1.

The following description will focus on the process of the formation of the chip carrier semiconductor device as described above and illustrated in FIG. 5. The center, intermediate and peripheral openings 5, 2b and 2c as well as the leads 3 with the bumps 4a are formed in the tape carrier 2. The tape carrier 2 is positioned to overlap the semiconductor chip so that the bent portions 3a of the leads 3 make contact with the contact pads 1a through the intermediate openings 2b. The sealing resin 6 is introduced through the center opening 5 into the space defined between the surface of the semiconductor chip 1 and the tape carrier 2 for sealing the surface of the semiconductor chip 1. The external test probes make contact with the test pads 7 for conducting various tests of performances of the semiconductor chip 1 such as electrical tests or burn-in tests. The tape carrier 2 is cut to separate the semiconductor substrate 1 from the tape carrier 2. Thus, the test pads 7 are simultaneously separated from the semiconductor ship 1 to thereby permit the bonding of the semiconductor chip 1 on the packaging substrate not illustrated.

According to the present invention, a tape carrier, that has been cut, extends over the entire semiconductor chip 1 to ensure an overlapping area of the tape carrier 2 remains after cutting the tape carrier 2. This may permit the leads to extend outside the semiconductor chip 1 on the tape carrier 2 extending over the chip area. This may further permit providing extra bumps to increase the number of the connections between the semiconductor chip 1 and the packaging substrate.

A sixth embodiment according to the present invention will be described with reference to FIG. 6 in which a novel tape carrier structure bonded on a semiconductor chip before bonding the semiconductor chip to a packaging substrate is provided.

The chip carrier semiconductor device of the sixth embodiment has a structural difference from that of the fifth embodiment by providing extra bumps on a portion of a tape carrier extending over the area of the semiconductor chip 1 to increase the number of the bumps. Namely, the bumps are provided not only inside of the contact pads 1a provided on the semiconductor chip 1 but also outside of the contact pads 1a.

The semiconductor chip 1 is provided on the tape carrier 2 that has a center opening 5, and intermediate openings 2b formed to be spaced apart from the center opening 5, and to surround the center opening 5 and peripheral openings 2c being formed to be spaced apart from the intermediate openings 2b spaced apart and to surround the intermediate openings 2b. An area of the tape carrier 2 defined between the intermediate and peripheral openings 2b and 2c may serve as a tape frame 2a which along with the semiconductor chip 1 is cut from the tape carrier 2. The tape frame 2a has a slightly larger size than the semiconductor chip 1. A plurality of leads is provided on the tape carrier 2. Each of the leads has one end 3b being found on the tape carrier 2 and thereon with inside bumps 4a inside the contact pads 1a and outside bumps 4b outside the contact pads 1a in random for subsequent bonding of the semiconductor chip to the packaging substrate which is not illustrated. Each of the leads also has an opposite end being expanded to form a test pad 7 to which a test probe makes contact.

Figure 6:
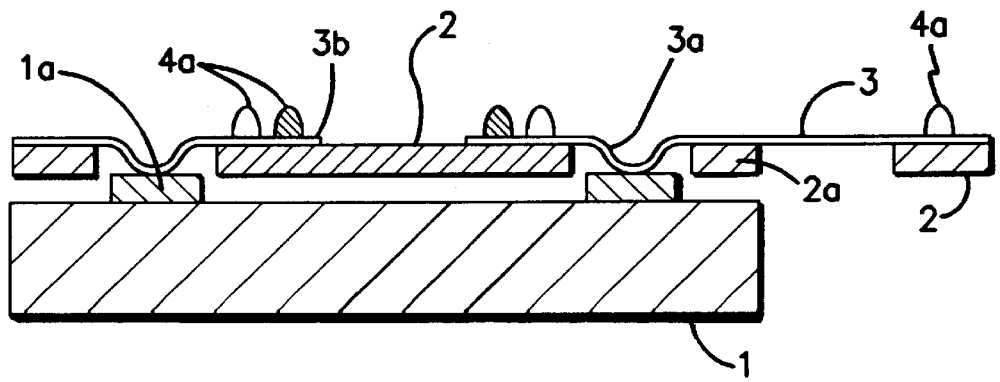
FIG. 6 is a fragmentary cross sectional elevation view of a novel chip carrier semiconductor device in a sixth embodiment according to the present invention.

Referring to FIG. 6, the semiconductor chip 1 is provided thereon with a plurality of contact pads 1a positioned under the intermediate openings 2b of the tape carrier 2. Each of the leads 3 has a bent portion 3a through which the leads 3 make contact with the contact pads 1a so that the leads 3 are electrically connected to the semiconductor chip 1.

The following description will focus on the process of the formation of the chip carrier semiconductor device as described above and illustrated in FIG. 6. The center, intermediate and peripheral openings 5, 2b and 2c as well as the leads 3 with the bumps 4a are formed in the tape carrier 2. The tape carrier 2 is positioned to overlap the semiconductor chip so that the bent portions 3a of the leads 3 make contact with the contact pads 1a through the intermediate openings 2b. The sealing resin 6 is introduced through the center opening 5 into the space defined between the surface of the semiconductor chip 1 and the tape carrier 2 for sealing the surface of the semiconductor chip 1. The external test probes make contact with the test pads 7 for conducting various tests of performances of the semiconductor chip 1 such as electrical tests or burn-in tests. The tape carrier 2 is cut to separate the semiconductor substrate 1 from the tape carrier 2. Thus, the test pads 7 are simultaneously separated from the semiconductor ship 1 to thereby permit the bonding of the semiconductor chip 1 on the packaging substrate not illustrated.

According to the present invention, extra bumps are provided on a portion of a tape carrier extending over the area of the semiconductor chip 1 to increase the number of the bumps. Namely, the bumps are provided not only inside of the contact pads 1a provided on the semiconductor chip 1 but also outside of the contact pads 1a.

Figure 7:
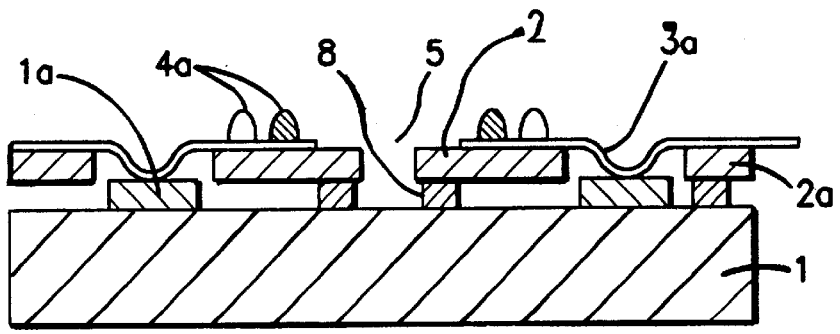
FIG. 7 is a fragmentary cross sectional elevation view of a novel chip carrier semiconductor device in a seventh embodiment according to the present invention.

A seventh embodiment according to the present invention will be described with reference to FIG. 7 in which a novel tape carrier structure bonded on a semiconductor chip before bonding the semiconductor chip to a packaging substrate is provided.

The chip carrier semiconductor device of the seventh embodiment has a structural difference from that of the second embodiment in that it provides spacers 8 on which the tape carrier 2 overlies wherein the spacer 8 has almost the same height as that of the contact pads 1a provided on the semiconductor chip 1 to thereby ensure a good flatness of the tape carrier 2. It is desirable that the height of the spacer is 50 micrometers to permit facilitating an introduction of the sealing resin 6 into the space defined between the surface of the semiconductor chip 1 and the tape carrier 2. Improvement in the flatness of the tape carrier 2 provided on the spacers 8 may prevent a variation in level of the bumps to thereby permit a high accuracy bonding between the semiconductor chip 1 and the packaging substrate not illustrated.

Figure 8:
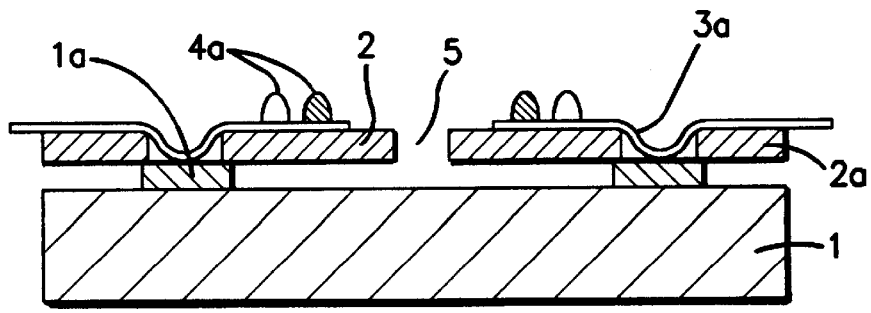
FIG. 8 is a fragmentary cross sectional elevation view of a novel chip carrier semiconductor device in an eight embodiment according to the present invention.

An eighth embodiment according to the present invention will be described with reference to FIG. 8 in which a novel tape carrier structure bonded on a semiconductor chip before bonding the semiconductor chip on a packaging substrate is provided.

The chip carrier semiconductor device of the eighth embodiment has a structural difference from that of the second embodiment in that it provides the tape carrier 2 on the contact pads 1a overlying on the semiconductor chip 1 so that the contact pads 1a may serve not only as electrical connection pads but also as spacers to thereby ensure a good flatness of the tape carrier 2 as well as to facilitate an introduction of the sealing resin 6 into the space defined between the surface of the semiconductor chip 1 and the tape carrier 2. Improvement in the flatness of the tape carrier 2 provided on the spacers 8 may prevent a variation in level of the bumps to thereby permit a high accuracy bonding between the semiconductor chip 1 and the packaging substrate not illustrated.

Whereas modifications of the present invention will no doubt be apparent to a person having ordinary skill in the art, to which the invention pertains, it is to be understood that embodiments shown and described by way of illustrations are by no means intended to be considered in a limiting sense. Accordingly, it is to be intended to cover by claims all modifications of the present invention which falls within the spirit and scope of the invention.

What is claimed is:

1. A method of forming a chip carrier semiconductor device comprising the steps of:

preparing a semiconductor chip having a plurality of contact pads;

preparing a tape carrier having a plurality of openings and a plurality of leads, each of said plurality of leads having an inside end being provided thereon with at least one bump, each of said plurality of leads having a bent portion;

superimposing said tape carrier on said semiconductor chip so that said bent portions of said plurality of leads contact respective said contact pads so that a distance separating said tape carrier and said semiconductor chip is defined solely by dimensions of said bent portions; and introducing a sealing resin through at least one of said openings into a space between said chip and said carrier to seal a surface of said semiconductor device.

2. A method of forming a chip carrier semiconductor device assembly comprising the steps of:

preparing a semiconductor chip having a plurality of contact pads;

preparing a tape carrier having a plurality of openings and a plurality of leads, each of said plurality of leads having an inside end being provided thereon with at least one bump, each of said plurality of leads having a bent portion;

superimposing said tape carrier on said semiconductor chip so that said bent portions of said plurality of leads contact respective said contact pads so that a distance separating said tape carrier and said semiconductor chip is defined solely by dimensions of said bent portions;

introducing a sealing resin through at least one of said openings into a space between said chip and said carrier to seal a surface of said semiconductor device;

subjecting said semiconductor chip to performance tests by use of external test probes;

cutting said tape carrier to separate said semiconductor chip and a part of said tape carrier within a chip area from a remaining part of said tape carrier; and bonding said semiconductor chip to a packaging substrate through said bumps.

* * * * *